Figure 1:
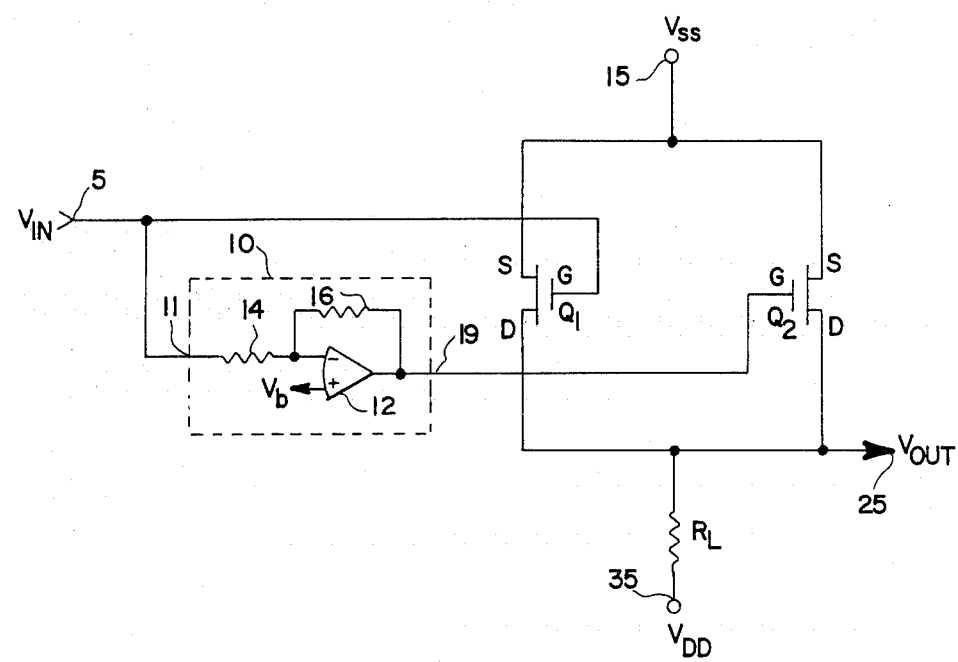

United States Patent [19]

Filliman

[11] Patent Number: 4,736,434
[45] Date of Patent: Apr. 5, 1988

[54] MOSFET ANALOG SIGNAL SQUARING CIRCUIT

[75] Inventor: Paul D. Filliman, Marion, Ind.

[73] Assignee: RCA Corporation, Princeton, N.J.

[21] Appl. No.: 2,289

[22] Filed: Jan. 12, 1987

[51] Int. Cl.$^4$ ............................................. H03G 7/00
[52] U.S. Cl. ...................................... 381/106; 381/2; 328/160; 358/144; 307/490
[58] Field of Search ............... 328/144, 160; 307/490, 307/498; 381/2, 3, 4, 106

[56] References Cited

U.S. PATENT DOCUMENTS

| | | | |
|---|---|---|---|
| 3,562,553 | 2/1971 | Roth | 328/160 |
| 4,071,777 | 1/1978 | Herrmann | 307/229 |
| 4,100,432 | 7/1978 | Miyakawa et al. | 328/160 |
| 4,101,966 | 7/1978 | Uzunoglu | 328/160 |
| 4,327,329 | 4/1982 | Papworth | 328/144 |
| 4,377,742 | 3/1983 | Kawabata et al. | 250/204 |
| 4,387,439 | 6/1983 | Lin | 307/498 |
| 4,546,275 | 10/1985 | Pena-Finol et al. | 328/160 |
| 4,577,226 | 3/1986 | Avins | 358/144 |
| 4,585,961 | 4/1986 | Daubert | 328/144 |
| 4,661,851 | 4/1987 | Muterspaugh | 381/106 |

OTHER PUBLICATIONS

"Electronic Principles Physics, Models, and Circuits"; Gray et al.; John Wiley & Sons, Inc., New York; 1969; pp. 329–336.

"4-Bit-by-4-Bit Parallel Binary Multipliers" Bulletin, No. DL-S7211741, May 1972 (revd Dec. '72); Texax Inst. Inc.

"Op Amp Circuit Collection"; Application Note 31; R. C. Dobkin; Feb. 1978; National Semiconductor, pp. AN 31-1, 15, 17-20.

"A Companding System for Multichannel TV Sound", L. B. Tyler et al., IEEE Trans. on Consumer Electronics, vol. CE-30, No. 4, Nov. 1984, pp. 633–640.

Primary Examiner—Forester W. Isen
Attorney, Agent, or Firm—E. M. Whitacre; P. J. Rasmussen; E. P. Herrmann

[57] ABSTRACT

A MOSFET analog signal squaring circuit is disclosed. A first MOSFET has a source electrode coupled to a bias voltage source, a gate electrode coupled to an input terminal, and a drain electrode coupled to an output terminal. A signal inverter is also coupled to the input terminal. A second MOSFET has a source electrode coupled to the bias voltage source, gate electrode coupled to the signal inverter, and a drain electrode coupled to the output terminal. A load impedance is coupled between the output terminal and a supply voltage source.

8 Claims, 2 Drawing Sheets

MOSFET ANALOG SIGNAL SQUARING CIRCUIT

The present invention relates to a circuit, for producing a signal having a value which represents the square of the value of the input signal, including metal oxide semiconductor field-effect transistors (MOSFET).

In the processing of signals, it is sometimes required to generate a signal having a value representing the square of the value of the input signal. For example, some noise reduction systems, such as both the dbx (registered trademark of dbx Corporation) system and the Broadcast Television System Committee (BTSC) television multichannel sound system require adaptive processing of an input signal based on the instantaneous root mean square (rms) value of the input signal. In order to calculate the rms value, it is required to calculate the square of the value of the input signal.

The calculation of the square of the value of the input signal may be carried out in analog or digital form. A digital signal squarer may be implemented several ways. A read only memory (ROM), with the input digital signal coupled to the address input terminals, and having each location preprogrammed with data representing the square of the value of its address, will produce a squared signal. Altervatively, a digital multiplier, with the input signal coupled to both the multiplier and multiplicand input terminals, will produce a squared signal. Both of these are complicated circuits and require a relatively large area on an integrated circuit chip.

An analog signal squarer may also be implemented several ways. A cascade connection of a log function generator, a signal value doubler, and an antilog function generator will produce a squared signal in the logarithmic domain. Alternatively, an analog multiplier with the input signal coupled to both the multiplier and multiplicand input terminals, will produce a squared signal. In either case, such an analog circuit requires several operational amplifiers and significant amount of external circuitry to perform properly, and also would require a relatively large area on an integrated circuit chip.

It is desirable to fabricate a signal squaring circuit which requires a minimum of circuitry and which may be easily fabricated on an integrated circuit chip.

In accordance with principles of the present invention, an analog signal squaring circuit utilizes MOSFETS. A first MOSFET has a source electrode coupled to a bias voltage source, a gate electrode coupled to an input terminal, receiving an input signal, and a drain electrode coupled to an output terminal, producing the squared output signal. A signal inverter is also coupled to the input terminal. A second MOSFET has a source electrode coupled to the bias voltage source, a gate electrode coupled to the signal inverter and a drain electrode coupled to the output terminal. A load impedance is coupled between the output terminal and a supply voltage source.

IN THE DRAWING

Figure 2:
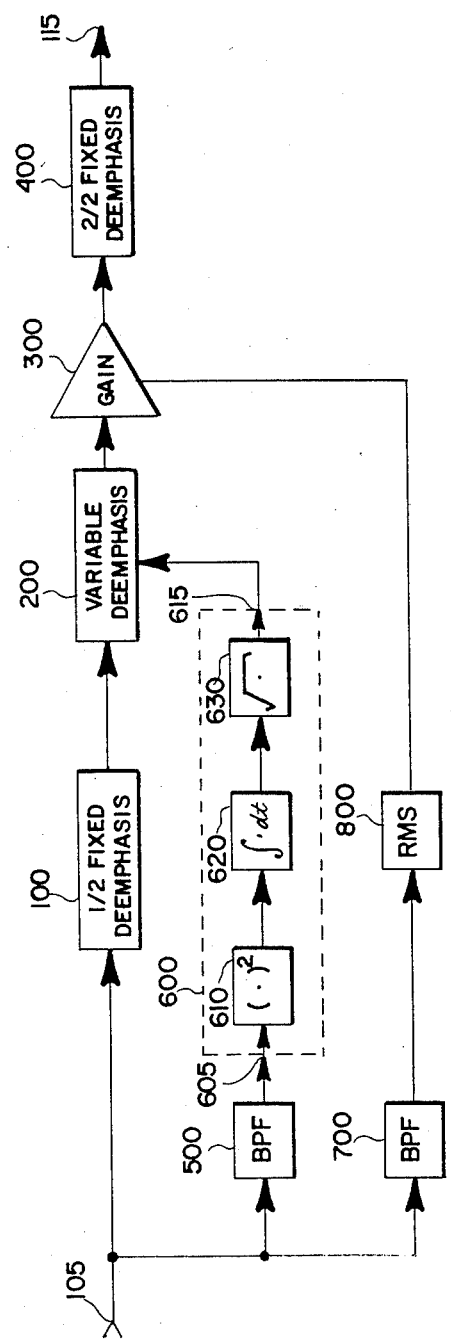

FIG. 1 is a schematic diagram of an analog signal squarer in accordance with principles of the present invention; and FIG. 2 is a block diagram of a BTSC multichannel television sound expander which may incorporate a squarer as illustrated in FIG. 1.

In FIG. 1, an input terminal 5 is coupled to a source (not shown) of an analog input signal $V_{IN}$, consisting of a DC offset component $V_b$, and an information component $e_{in}$ the square of whose value is desired. Input terminal 5 is coupled to a gate electrode G of a MOSFET $Q_1$ and to an input terminal 11 of a signal inverter 10. A source electrode S of MOSFET $Q_1$ is coupled to a bias voltage terminal 15. Bias voltage terminal 15 is coupled to a source (not shown) of a bias voltage $V_{SS}$. The drain electrode D of MOSFET $Q_1$ is coupled to an output terminal 25. Output terminal 25 is coupled to utilization circuitry (not shown) and produces an analog output signal $V_{OUT}$ consisting of a DC offset component, and an information component having a value which is proportional to the square of the value of the information component $e_{in}$ of analog input signal $V_{IN}$.

An output terminal 19 of signal inverter 10 is coupled to a gate electrode G of MOSFET $Q_2$. A source electrode S of MOSFET $Q_2$ is coupled to the bias voltage terminal 15 and a drain electrode D of MOSFET $Q_2$ is coupled to the output terminal 25. A load impedance $R_L$ is coupled between the output terminal 25 and the supply voltage terminal 35. Supply voltage terminal 35 is coupled to a source of supply voltage $V_{DD}$.

Signal inverter 10 comprises an analog inverting unity gain amplifier having an input resistor 14 coupled between the input terminal 11 of signal inverter 10 and an inverting input terminal $(-)$ of an operational amplifier 12. An output terminal of operational amplifier 12 is coupled to the inverting input terminal through a feedback resistor 16 and to the output terminal 19 of signal inverter 10. The non-inverting $(+)$ input terminal of operational amplifer 12 is coupled to a DC voltage source which produces a potential $V_b$ equal to the DC offset voltage of the input voltage $V_{IN}$. For an input signal $V_{IN}$, signal inverter 10 produces an output signal $2V_b - V_{IN}$.

The operation of the circuit illustrated in FIG. 1 and described above depends upon the drain current characteristics of a MOSFET. When operated in the saturation region, the drain current is:

$$I_D = \beta(V_{GS} - V_p)^2 \text{ for } V_{DS} >> (V_{GS} - V_P) \ \& \ (V_{GS} - V_P) > 0 \quad (1)$$

Where $I_D$ is the drain current, $V_{GS}$ is the voltage occurring between the gate and source electrodes, $V_{DS}$ is the drain-source voltage and $\beta$ and $V_P$ are device constants depending upon the geometry and fabrication of the MOSFET. The first condition $V_{DS} >> (V_{GS} - V_P)$ corresponds to the MOSFET operating in its saturated region. The second condition, $(V_{GS} - V_P) > 0$, gives the range of over which the equation is valid. For $(V_{GS} - V_P) < 0$, $I_D = 0$; that is, the MOSFET does not conduct.

$V_{IN}$ may be described mathematically by the equation:

$$V_{IN} = V_b + e_{in} \quad (2)$$

From the circuit illustrated in FIG. 1, the gate-source voltage $V_{GS}$ is:

$$V_{GS} = V_{IN} - V_{SS} \quad (3)$$

If $V_{SS}$ has the value:

$$V_{SS} = V_b - V_P \quad (4)$$

then:

$$(V_{GS}-V_P)=(V_b+e_{in})-(V_b-V_P)-V_P=e_{in} \quad (5)$$

where the first term represents $V_{IN}$ as given in equation (2) and the second term represents $V_{SS}$ as given in equation (4). As can be seen, the quantities $V_b$ and $V_P$ cancel out, leaving only $e_{in}$.

The drain current $I_{D1}$ through MOSFET $Q_1$ is thus:

$$I_{D1}=\beta e_{in}^2 \text{ for } e_{in}>0 \quad (6)$$

with the value for $(V_{GS}-V_P)$ from equation (5) substituted for the corresponding value in equation (1). As indicated, equation (6) is valid so long as the information component $e_{in}$ of the input signal $V_{IN}$ supplied at terminal 5 is greater than 0. If it is less than 0, then $I_{D1}$ of MOSFET $Q_1$ is 0. Signal inverter 10, however, inverts the information component $e_{in}$ (i.e. produces an information component $-e_{in}$) of the input signal $V_{IN}$, while maintaining the DC offset component $V_b$ constant. MOSFET $Q_2$ therefore provides a drain current $I_{D2}$ analogously to equation (6) when signal $-e_{in}$ is greater than 0 (or when $e_{in}$ is less than 0), and produces a drain current $I_{D2}$ of 0 otherwise. The potential difference across load resistor $R_L$ is:

$$V_{OUT}-V_{DD}=(I_{D1}+I_{D2})R_L \quad (7)$$

But as described above, MOSFETS $Q_1$ and $Q_2$ conduct in a mutually exclusive manner based on the sign of the value of the information component $e_{in}$ of input signal $V_{IN}$. Thus:

$$V_{OUT}-V_{DD}=I_{D1}R_L=\beta R_L e_{in}^2 \text{ for } e_{in}>0 \quad (8)$$

and $$V_{OUT}-V_{DD}=I_{D2}R_L(-e_{in})^2=\beta R_L e_{in}^2 \text{ for } e_{in}>0 \quad (9)$$

Rearranging:

$$V_{OUT}=\beta R_L e_{in}^2 + V_{DD} \text{ for all } e_{in} \quad (10)$$

where $\beta R_L e_{in}^2$ is the value of the information component, and the voltage $V_{DD}$ from supply voltage terminal 35 is the value of the DC offset component of the output signal $V_{OUT}$.

The voltage $V_{DD}$ supplied to supply terminal 35 must be of a proper value to make $V_{DS}>>(V_{GS}-V_P)$ and thus satisfy the first condition in equation (1). Subject to that constraint, it may be set to a value which will supply any desired DC offset component in the output signal $V_{OUT}$.

The above circuit has been described with reference to an n-channel enhancement mode MOSFET. P-channel enhancement mode MOSFETS or p or n-channel depletion mode MOSFETS could also be used, provided the voltages $V_{SS}$ and $V_{DD}$ coupled to the bias voltage terminal and supply voltage terminal 35, respectively, are properly calculated according to the above equations in a manner known to one skilled in the art of MOSFET circuit design.

FIG. 2 illustrates a block diagram of a BTSC multi-channel television sound expander which may be used in a television receiver capable of reproducing a stereophonic or second audio program sound signal. In FIG. 2, an input terminal 105 is coupled to a source (not shown) of a compressed stereophonic (L-R) sound signal or compressed SAP sound signal. Input terminal 105 is coupled to an input terminal of a first of two (½) fixed deemphasis filter 100, a bandpass filter 500 and a bandpass filter 700. An output terminal of the first fixed deemphasis filter 100 is coupled to an input terminal of a variable deemphasis network 200. An output terminal of variable deemphasis terminal 200 is coupled to an input terminal of a variable gain amplifier 300. An output terminal of the variable gain amplifier 300 is coupled to an input terminal of a second of two (2/2) fixed deemphasis filter 400. An output terminal of the second fixed deemphasis filter 400 is coupled to an output terminal 115. Output terminal 115 may be coupled to an input terminal of a stereophonic matrix in the case of a (L-R) signal or to a sound reproducing channel in the case of an SAP signal (neither shown).

An output terminal of bandpass filter 500 is coupled to an input terminal 605 of a root mean square detector 600. An output terminal 615 of root mean square detector 600 is coupled to a control input terminal of variable deemphasis network 200. Root mean square detector 600 consists of the serial connection of a signal squarer 610, an integrator 620, and a square mean root function circuit 630 coupled between the input 605 and output 615 terminals.

An output terminal of bandpass filter 700 is coupled to an input terminal of a root mean square (rms) detector 800 which may be similar to root mean square detector 600. An output terminal of root mean square detector 800 is coupled to a control input terminal of variable gain amplifier 300.

In operation, the signal expander illustrated in FIG. 2 adaptively expands the input audio signal from input terminal 105 through the serial connection of the first fixed deemphasis filter 100, the variable deemphasis network 200, the variable gain amplifier 300 and the second fixed deemphasis filter 400. Variable spectral expansion, performed by the variable deemphasis network 200, is controlled by the serial connection of bandpass filter 500 and the rms detector 600. Wideband expansion, performed by the variable gain amplifier 300, is controlled by the serial connection of bandpass filter 700 and rms detector 800. A more detailed description of the above circuit is found in the article, "A Companding System for Multichannel TV Sound" by Tyler et al. in IEEE Transactions on Consumer Electronics, Vol. CE-30 No.4, November 1984 pp. 633–640.

In order to minimize cost of a consumer television receiver, it is desirable to implement this function on an integrated circuit chip. The squarer according to principles of the present invention, as illustrated in FIG. 1, may be used advantageously to perform the squaring function of squarer 610 within the rms detector 600, or analagously in rms detector 800, (of FIG. 2).

What is claimed is:

1. A MOSFET analog signal squaring circuit, including input and output terminals, and bias and supply voltage terminals, said squaring circuit comprising:

a first MOSFET having a source electrode coupled to said bias voltage terminal, a gate electrode coupled to said input terminal, and a drain electrode coupled to said output terminal;

a signal inverter coupled to said input terminal;

a second MOSFET having a source electrode coupled to said bias voltage terminal, a gate electrode coupled to said signal inverter, and a drain electrode coupled to said output terminal; and a load impedance coupled between said output terminal and said supply voltage terminal.

2. The circuit of claim 1 wherein said signal inverter comprises:
  input and output terminals;
  an operational amplifier having an inverting input terminal, a non-inverting input terminal coupled to a source of a DC offset voltage, and an output terminal coupled to said output terminal of said inverter;
  an input resistor coupled between said input terminal of said inverter and said inverting input terminal of said operational amplifier; and
  a feedback resistor coupled between said output terminal of said operational amplifier and said inverting input terminal of said operational amplifier.

3. The circuit of claim 1, wherein said load impedance comprises a resistor coupled between said output terminal and said supply voltage terminal.

4. The circuit of claim 1, wherein: the value of a voltage $V_{IN}$ at said input terminal is:

$$V_{IN} = V_b + e_{in}$$

where $V_b$ is a DC offset component and $e_{in}$ is an information component; and
the value of a voltage $V_{SS}$ at said bias voltage terminal is:

$$V_{SS} = V_b - V_P$$

where $V_P$ is a MOSFET device constant.

5. A television receiver comprising:
  a source of a compressed audio sound signal;
  a first fixed deemphasis filter having an input terminal coupled to said source and an output terminal;
  a variable deemphasis network having a signal input coupled to said output terminal of said first fixed deemphasis filter, a control input terminal and an output terminal;
  a variable gain amplifier having a signal input terminal coupled to said output terminal of said variable deemphasis network, a control input terminal and an output terminal;
  a second fixed deemphasis filter having an input terminal coupled to said output terminal of said variable gain amplifier and an output terminal;
  a first bandpass filter having an input terminal coupled to said source and an output terminal;
  a first root mean square detector having an input terminal coupled to said output terminal of said first bandpass filter and an output terminal coupled to said control input terminal of said variable deemphasis network;
  a second bandpass filter having an input terminal coupled to said source and an output terminal;
  a second rms detector having an input terminal coupled to said output terminal of said second bandpass filter and an output terminal coupled to said control input terminal of said variable gain amplifier; wherein:
  at least one of said first and second rms detectors includes a MOSFET analog signal squaring circuit including input and output terminals and bias and supply voltage terminals, said squaring circuit comprising: a first MOSFET having a source electrode coupled to said bias voltage terminal, a gate electrode coupled to said input terminal and a drain electrode coupled to said output terminal; a signal inverter coupled to said input terminal; a second MOSFET having a source electrode coupled to said bias voltage terminal; a gate electrode coupled to said signal inverter and a drain electrode coupled to said output terminal; and a load impedance coupled between said output terminal and said supply voltage terminal.

6. The receiver of claim 5, wherein said signal inverter comprises:
  input and output terminals;
  an operational amplifier having an inverting input terminal, a non-inverting input terminal coupled to a source of a DC offset voltage and an output terminal coupled to said output terminal of said inverter;
  an input resistor coupled between said input terminal of said inverter and said inverting input terminal of said operational amplifier; and
  a feedback resistor coupled between said output terminal of said operational amplifier and said inverting input terminal of said operational amplifier.

7. The receiver of claim 5, wherein said load impedance comprises a resistor coupled between said output terminal and said supply voltage terminal.

8. The receiver of claim 5, wherein:
  the value of a voltage $V_{IN}$ at said input terminal of said signal squarer is:

$$V_{IN} = V_b + e_{in}$$

where $V_b$ is a DC offset component and $e_{in}$ is an information component; and
the value of a voltage $V_{SS}$ at said bias voltage terminal is:
  $V_{SS} = V_b - V_P$ where $V_P$ is a MOSFET device constant.

* * * * *

UNITED STATES PATENT AND TRADEMARK OFFICE
CERTIFICATE OF CORRECTION

PATENT NO. : 4,736,434

DATED : April 5, 1988

INVENTOR(S) : Paul Dean Filliman

It is certified that error appears in the above-identified patent and that said Letters Patent is hereby corrected as shown below:

Column 2, line 51, should read " of $V_{GS}$ over" instead of "of over"

Column 3, Equation (9) should read

"$V_{OUT} - V_{DD} = I_{D2}R_L = \beta R_L(-e_{in})^2 = \beta R_L e_{in}^2$   for $e_{in} < 0$"

Column 3, line 56, should read "terminal 15 and" instead of "terminal and"

Signed and Sealed this

Twenty-fifth Day of October, 1988

Attest:

DONALD J. QUIGG

*Attesting Officer*   *Commissioner of Patents and Trademarks*